United States Patent
Kuroda et al.

(10) Patent No.: US 7,936,049 B2
(45) Date of Patent: *May 3, 2011

(54) NITRIDE SEMICONDUCTOR DEVICE AND MANUFACTURING METHOD THEREOF

(75) Inventors: Masayuki Kuroda, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/823,325

(22) Filed: Jun. 25, 2010

(65) Prior Publication Data

US 2010/0264517 A1    Oct. 21, 2010

Related U.S. Application Data

(63) Continuation of application No. 12/041,825, filed on Mar. 4, 2008, now Pat. No. 7,777,305.

(30) Foreign Application Priority Data

Mar. 9, 2007    (JP) .................................. 2007-060848

(51) Int. Cl.
  *H01L 21/338*    (2006.01)
  *H01L 29/812*    (2006.01)
  *H01L 29/778*    (2006.01)

(52) U.S. Cl. .......... 257/624; 257/76; 257/192; 257/193; 257/618; 257/627; 257/623; 257/625; 257/E29.246; 257/E21.108; 438/479; 438/507

(58) Field of Classification Search .................... 257/76, 257/E29.246, E21.113, E21.108, 192–193, 257/623–625, 618, 627; 438/479, 507
See application file for complete search history.

(56) References Cited

U.S. PATENT DOCUMENTS

| | | | |
|---|---|---|---|
| 4,186,410 A | | 1/1980 | Cho et al. |
| 5,350,936 A | * | 9/1994 | Ikalainen et al. .............. 257/194 |
| 5,408,120 A | * | 4/1995 | Manabe et al. ................ 257/431 |
| 5,880,485 A | * | 3/1999 | Marx et al. ....................... 257/94 |
| 6,086,673 A | * | 7/2000 | Molnar ............................ 117/90 |

(Continued)

FOREIGN PATENT DOCUMENTS

JP    2005-026671    1/2005

(Continued)

OTHER PUBLICATIONS

Chen et al. (Ultraviolet Light Emitting Diodes Using Non-Polar a-Plane GaN-AlGaN Multiple Quantum Wells) Jpn. J Appl. Phys. vol. 42 (2003) pp. L1039-L1040.*

(Continued)

*Primary Examiner* — Zandra Smith
*Assistant Examiner* — Jeremy J Joy
(74) *Attorney, Agent, or Firm* — Greenblum & Bernstein, P.L.C.

(57) ABSTRACT

It is an object of the present invention to provide a nitride semiconductor device with low parasitic resistance by lowering barrier height to reduce contact resistance at an interface of semiconductor and metal. The nitride semiconductor device includes a GaN layer, a device isolation layer, an ohmic electrode, an n-type $Al_{0.25}Ga_{0.75}N$ layer, a sapphire substrate, and a buffer layer. A main surface of the n-type $Al_{0.25}Ga_{0.75}N$ layer is on (0 0 0 1) plane as a main surface, and concaves are arranged in a checkerboard pattern on the surface. The ohmic electrode contacts the sides of the concaves of the n-type $Al_{0.25}Ga_{0.75}N$ layer, and the sides of the concaves are on non-polar surfaces such as (1 1 −2 0) plane or (1 − 1 0 0) plane.

3 Claims, 11 Drawing Sheets

| | (11-20) Plane | (0001) Plane |
|---|---|---|
| $R_C(\Omega cm^2)$ | $8.22 \times 10^{-6}$ | $1.43 \times 10^{-5}$ |
| $\Phi_B(eV)$ | 0.534 | 0.997 |

U.S. PATENT DOCUMENTS

| | | | |
|---|---|---|---|
| 6,787,820 B2 * | 9/2004 | Inoue et al. | 257/192 |
| 6,933,181 B2 | 8/2005 | Inoue et al. | |
| 7,187,014 B2 | 3/2007 | Hirose et al. | |
| 7,521,732 B2 * | 4/2009 | Matocha et al. | 257/192 |
| 7,777,305 B2 * | 8/2010 | Kuroda et al. | 257/624 |
| 2004/0188807 A1 * | 9/2004 | Hiraoka et al. | 257/623 |
| 2005/0274980 A1 | 12/2005 | Miyoshi | |
| 2006/0175633 A1 * | 8/2006 | Kinzer | 257/192 |
| 2006/0203871 A1 | 9/2006 | Ueda et al. | |
| 2006/0223211 A1 * | 10/2006 | Mishra et al. | 438/41 |
| 2007/0252164 A1 * | 11/2007 | Zhong et al. | 257/98 |
| 2008/0121896 A1 | 5/2008 | Takizawa et al. | |
| 2008/0173898 A1 * | 7/2008 | Ohmaki | 257/194 |

FOREIGN PATENT DOCUMENTS

JP  2006-287212  10/2006

OTHER PUBLICATIONS

Chen et al., "Ultra Violet Light Emitting Diodes Using Non-Polar a-Plane GaN-AlGaN Multiple Quantum Wells," Japanese J. Appl. Phys., vol. 42, pp. 1039-1040. 2003.

U.S. Appl. No. 11/738,655 to Toshiyuki Takizawa et al., filed Apr. 23, 2007.

* cited by examiner

FIG. 1A
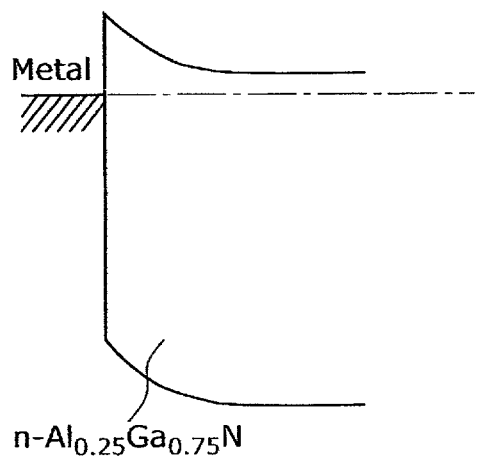
FIG. 1B
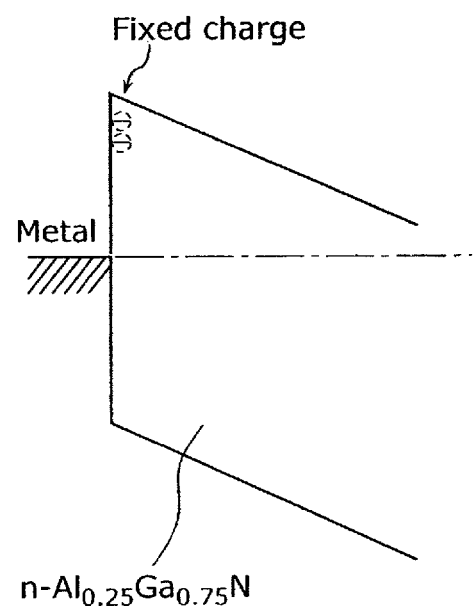
FIG. 2
|  | (11-20) Plane | (0001) Plane |
|---|---|---|
| $R_C (\Omega cm^2)$ | $8.22 \times 10^{-6}$ | $1.43 \times 10^{-5}$ |
| $\Phi_B (eV)$ | 0.534 | 0.997 |

NITRIDE SEMICONDUCTOR DEVICE AND MANUFACTURING METHOD THEREOF

CROSS-REFERENCE TO RELATED APPLICATIONS

This application is a continuation of application Ser. No. 12/041,825, filed Mar. 4, 2008, the disclosure of which is incorporated by reference herein in its entirety. The application also claims priority of Japanese Patent Application No. 2007-060848, filed Mar. 9, 2007, which is incorporated by reference herein in its entirety.

BACKGROUND OF THE INVENTION (1) Field of the Invention

The present invention relates to a field effect transistor made of high breakdown voltage nitride semiconductor having high frequency and the manufacturing method thereof.

(2) Description of the Related Art

Group-III nitride semiconductors such as GaN have advantageous properties such as large bandgap, large dielectric strength, and high saturated drift velocities of electrons, and are expected to be applied to high frequency and high output devices. Furthermore, in an AlGaN/GaN heterojunction, highly concentrated two-dimensional electron gas (2DEG) at approximately $1\times10^{13}$ cm$^{-2}$ is generated on a heterojunction interface due to spontaneous polarization and piezoelectric polarization. Electric devices such as a Field Effect Transistor (FET) and a Schottky Barrier Diode (SBD) made of the nitride semiconductors are actively developed using these properties.

In order to improve the properties of the Group-III nitride semiconductor device, it is necessary to reduce parasitic resistance components such as contact resistance and channel resistance in the semiconductor device. Among the parasitic resistance components, the resistance component in the channel layer may be reduced by miniaturization of the device and reduction of the sheet resistance, in such cases, it is assumed that resistance component caused by the ohmic contact will likely to be more significant. Furthermore, GaN tends to have a large contact resistance since the bandgap is large at 3.4 eV. For example, in a miniaturized FET having gate length of 0.1 µm, a source-gate distance and a gate-drain distance of 0.2 µm, and when the ohmic contact resistance is $\rho C=1\times10^{-5}$ $\Omega cm^2$, the ohmic contact resistance takes 80% or more of the parasitic resistance component. Thus, the reduction of the contact resistance is essential for improving the properties of the device.

The following methods have been proposed for reducing the ohmic contact resistance in the Group-III nitride semiconductor devices. More specifically, a method for diffusing Si on the surface of AlGaN at a high temperature (see, for example, Patent reference 1: U.S. Pat. No. 6,933,181), a method for reducing the ohmic contact by using a low-resistance multi-layer film as a cap layer, where the low-resistance multi-layer film is formed by alternately laminating two semiconductor layers, each includes n-type impurities and have different directions of the piezoelectric polarization and the spontaneous polarization (see, for example, Patent reference 2: Japanese Unexamined Patent Application Publication No. 2005-26671) and a method using a cap layer made of $In_xAl_yGa_{1-x-y}N$ (0<x<1, 0<y<1) which reduces the barrier height on the interface of the cap layer and the electron supply layer (see, for example, Japanese Unexamined Patent Application Publication No. 2006-287212) have been proposed. With these methods, for example, a low-resistance field effect transistor with a super lattice structure, having $\rho C=1\times10^{-5}$ $\Omega cm^2$, and 0.4 $\Omega$mm of the source resistance is obtained.

SUMMARY OF THE INVENTION

However, the conventional Group-III nitride semiconductor device is formed on (0 0 0 1) plane on a substrate, and the barrier height at the interface of semiconductor and metal is higher due to a spontaneous polarization and a piezoelectric polarization which generates perpendicular to (0 0 0 1) plane. Thus, even when sintering (thermal treatment) is performed, the barrier height is not fully lowered at the interface of the semiconductor layer and metal, and thus the reduction of ohmic contact is limited.

In view of the above problems, it is an object of the present invention to provide a nitride semiconductor device with low parasitic resistance by reducing the ohmic contact resistance by lowering the barrier height on the interface of metal and semiconductor.

In view of the above, the inventors discovered that the barrier height of the interface of metal and semiconductor is lower when the interface is a so-called non-polar surface, compared to the case where the interface is a polar surface through experiments and conceived the present invention. In order to solve the problems above, the semiconductor device and the manufacturing method of the present invention have the following structure.

The nitride semiconductor device according to the present invention includes a nitride semiconductor layer, and an ohmic electrode in contact with a side in the nitride semiconductor layer, in which the side is a non-polar surface. Here, a main surface of said nitride semiconductor layer may be on (0 0 0 1) plane. In addition, concave portions and convex portions are formed on a surface of the nitride semiconductor layer, and the side is a side of each of the concave portions. Furthermore, a bottom surface of each of the concave portions may be on (0 3 –3 8) plane or on (0 3 –3 16) plane.

With this structure, the barrier height at the interface of the ohmic electrode and the nitride semiconductor layer can be reduced, and it is possible to reduce ohmic contact resistance. Therefore, a nitride semiconductor device with small parasitic resistance can be realized.

In addition, the concave portions may be arranged in a checkerboard pattern or a stripe pattern on the surface of the nitride semiconductor layer.

This structure can expand the contact area of the ohmic electrode and a non-polar surface, and thus the ohmic contact resistance can be reduced.

In addition, two of the ohmic electrode are a source electrode and a drain electrode respectively, and the source electrode and the drain electrode are respectively formed on two of the nitride semiconductor layer, the nitride semiconductor device further comprises a first semiconductor layer on which two of the nitride semiconductor layers are formed, a gate electrode formed on the first semiconductor layer, and the nitride semiconductor layer makes up a low resistance cap layer.

With this structure, the low-resistance cap layer is arranged in a current pathway between the source electrode and the drain electrode without contacting the gate electrode. As a result, the serial resistance between the source and the drain can be reduced.

In addition, the nitride semiconductor layer may be made of a layer in which AlGaN and GaN are alternately laminated, or InxAlyGa1-x-yN, where 0<x<1 and 0<y<1.

With this structure, the barrier height at the interface of the low resistance cap layer and the first semiconductor layer is lowered, and the serial resistance between the source and the drain can be reduced.

In addition, the nitride semiconductor device may further include: a substrate; a second semiconductor layer formed on the substrate; and a dielectric film having an opening formed on the second semiconductor layer, in which the nitride semiconductor layer is formed by crystal growth on a portion of the second semiconductor layer exposed at the opening.

With this structure, the nitride semiconductor layer can be formed to have tilted sides and horizontal surfaces by Epitaxial Lateral Overgrowth (ELO). Consequently, the tilted sides are made to be non-polar surfaces and an ohmic electrode is formed to be in contact with the sides, the barrier height at the interface of the ohmic electrode and the nitride semiconductor layer is lowered, resulting in the reduction of ohmic contact resistance.

In addition, the nitride semiconductor device may further include a third semiconductor layer which is in a heterojunction with the nitride semiconductor layer. Here, concave portions and convex portions are formed on a surface of the nitride semiconductor layer, and the concave portions are formed to pass through the nitride semiconductor layer and to reach the third semiconductor layer.

With this structure, two-dimensional electron gas is formed at the interface of the nitride semiconductor layer and the third semiconductor layer, and the two-dimensional electron gas can be an electron channel. With this, the ohmic contact resistance can be reduced since the ohmic electrode directly contacts the two-dimensional electron gas. Therefore, a field effect transistor with small serial resistance component can be realized.

In addition, the nitride semiconductor layer may be made of one of AlGaN and GaN, and the third semiconductor layer may be made of the other one of AlGaN and GaN.

With this structure, it is possible to form a two-dimensional electron gas layer having one of AlGaN layer and GaN layer as the electron channel layer, and having the other one of AlGaN layer and GaN layer as the electron barrier layer. Therefore, a field effect transistor with small serial resistance component can be realized.

In addition, the side is on one of (1 1 –2 0) plane, (1 –1 0 0) plane, (0 3 –3 8) plane, and (0 3 –3 16) plane.

Since the same number of group-III atoms and group-V atoms are arranged on the same plane on the non-polar surface such as (1 1 –2 0) plane, (1 –1 0 0) plane, (0 3 –3 8) plane or (0 3 –3 16) plane, the spontaneous polarization at the contact surface with the ohmic electrode only in the horizontal direction but not the vertical direction. In the same manner, piezoelectric polarization does not occur in the vertical direction. Therefore, polarized electric charge does not generate on the surface of non-polar surfaces, and the barrier height at the interface of ohmic electrode and nitride semiconductor layer is reduced compared to a case where the ohmic electrode is formed on a polar surface such as (0 0 0 1) plane, and thus the ohmic contact resistance can be reduced.

Furthermore, the present invention may be a manufacturing method of a nitride semiconductor device including: forming a mask layer having an opening on a first nitride semiconductor layer; forming a second nitride semiconductor layer on a portion of the first nitride semiconductor layer exposed at the opening; removing the mask layer; and forming an ohmic electrode in contact with a side of the second nitride semiconductor, in which the side is a non-polar surface.

With this structure, it is possible to form an ohmic electrode contacting a side of the nitride semiconductor layer easily. With this, the ohmic contact resistance can be easily reduced.

Furthermore, the present invention may be a manufacturing method of a nitride semiconductor device including: forming a dielectric film having an opening on a foundation layer; forming a nitride semiconductor layer by a crystal growth of nitride semiconductor from a portion exposed at the opening of the foundation layer; and forming an ohmic electrode in contact with a side of the nitride semiconductor, in which the side is a non-polar surface.

With this structure, the nitride semiconductor layer can be formed to have tilted sides as non-polar surface and a horizontal surface by the Epitaxial Lateral Overgrowth (ELO). Consequently, the ohmic electrode is formed to be in contact with the non-polar surface, the ohmic contact resistance can be easily reduced.

Here, the side is on one of (1 1 –2 0) plane, (1 –1 0 0) plane, (0 3 –3 8) plane and (0 3 –3 16) plane.

Since the same number of group-III atoms and group-V atoms are arranged on the same plane on the non-polar surface such as (1 1 –2 0) plane, (1 –1 0 0) plane, (0 3 –3 8) plane or (0 3 –3 16) plane in plane direction, the spontaneous polarization at the contact surface with the ohmic electrode only generates in the horizontal direction of the contact surface but not in the vertical direction. In the same manner, piezoelectric polarization does not generate in the vertical direction. Therefore, polarized electric charge does not generate on the surface of non-polar surfaces, and the barrier height at the interface of ohmic electrode and nitride semiconductor layer is reduced compared to a case where an ohmic electrode is formed on a polar surface such as (0 0 0 1) plane, and thus the ohmic contact resistance can be reduced.

In addition, the nitride semiconductor device may include a heterojunction of AlGaN and GaN.

With this structure, two-dimensional electron gas is formed in the nitride semiconductor layer, and the two-dimensional electron gas can be an electron channel. Therefore, a field effect transistor with small serial resistance component can be realized.

According to the nitride semiconductor device and the manufacturing method of the present invention, a low-contact resistance ohmic electrode can be formed, and a nitride semiconductor device with small parasitic resistance component can be realized.

FURTHER INFORMATION ABOUT TECHNICAL BACKGROUND TO THIS APPLICATION

The disclosure of Japanese Patent Application No. 2007-060848 filed on Mar. 9, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 1A is a band diagram of a metal/$Al_{0.25}Ga_{0.75}N$ interface formed on (1 1 –2 0) plane;

FIG. 1B is a band diagram of a metal/$Al_{0.25}Ga_{0.75}N$ interface formed on (0 0 0 1) plane;

FIG. 2 is a chart showing contact resistance and schottky barrier height;

DESCRIPTION OF THE PREFERRED EMBODIMENT(S)

Figure 3A:
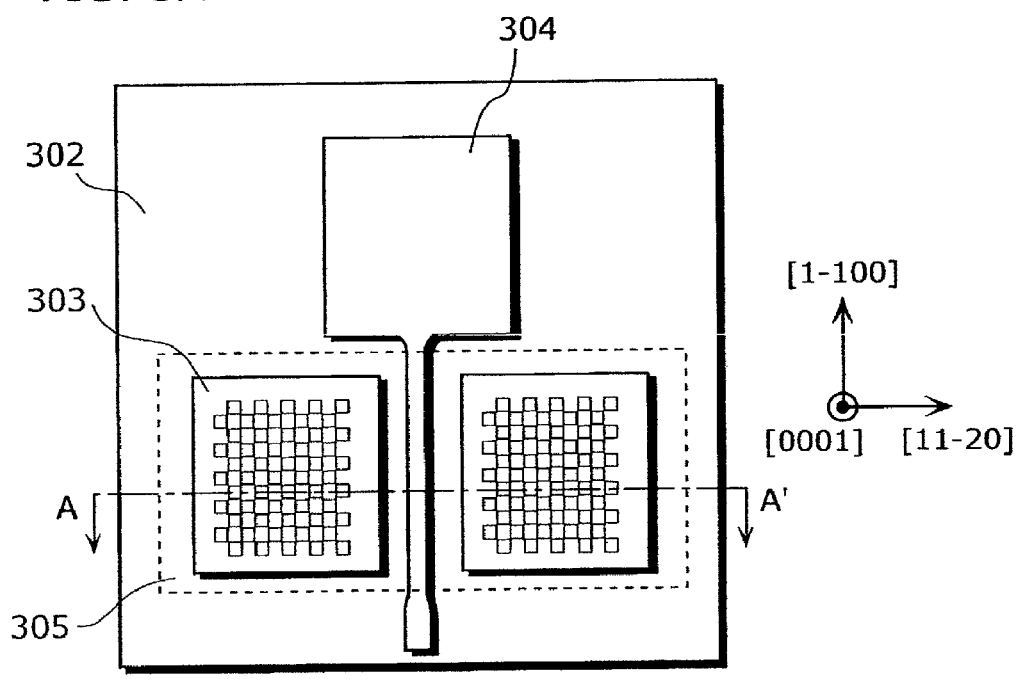
FIG. 3A is a top view of the HFET according to the first embodiment of the present invention.

A Nitride semiconductor device and a manufacturing method thereof according to the embodiments of the present invention will be described hereinafter with reference to the drawings.

First Embodiment

FIG. 1A is a band diagram of a metal/$Al_{0.25}Ga_{0.75}N$ interface formed on (1 1 −2 0) plane and FIG. 1B is a band diagram of a metal/$Al_{0.25}Ga_{0.75}N$ interface formed on (0 0 0 1) plane.

On the metal/$Al_{0.25}Ga_{0.75}N$ interface formed on (0 0 0 1) plane, piezoelectric polarization and spontaneous polarization cause polarized charge as shown in FIG. 1B, resulting in a high barrier at the metal/semiconductor interface. On the contrary, on the metal/$Al_{0.25}Ga_{0.75}N$ interface on the (1 1 −2 0) plane, since polarization electric field is not generated, which lower the barrier height on the metal and semiconductor interface. Here, the following equation (1) represents a contact resistance RC on the metal and semiconductor interface.

$$R_C = \frac{k}{qA^*T}\exp\left(\frac{q\Phi_{Bn}}{kT}\right) \quad \text{Equation (1)}$$

In the equation (1), k denotes Boltzmann constant, q denotes elementary charge, A* denotes Richardson constant, T denotes temperature, and φBn denotes the barrier height at the interface of AlGaN and the gate electrode. The equation indicates that the contact resistance can be reduced when the barrier height is lower. When the donor impurity concentration in the barrier layer is high, the width of the depletion layer narrows down and the tunnel current becomes dominant, which is represented by the following formula:

$$R_C \sim \exp\left[\frac{2\sqrt{\varepsilon_s m^*}}{h}\left(\frac{\Phi_{Bn}}{\sqrt{N_D}}\right)\right] \quad \text{Formula (2)}$$

In the formula (2), $\varepsilon_s$ denotes permittivity, m* denotes effective mass, and h denotes Planck constant. The equation indicates that, when the donor impurity concentration is the same, the contact resistance can be reduced when the barrier height is lower.

FIG. 2 shows contact resistances $R_C$ and a height of schottky barrier $\phi_B$ when an HFET made of n⁻-type $Al_{0.25}Ga_{0.75}N$/GaN on (0 0 0 1) plane or (1 1 −2 0) plane of substrate is formed. The contact resistance $R_C$ is a contact resistance when a Ti/Al ohmic electrode is formed on (0 0 0 1) plane or (1 1 −2 0) plane of n⁻-type $Al_{0.25}Ga_{0.75}N$/GaN and when sintering is performed for the Ti/Al ohmic electrode, and the height of schottky barrier $\phi_B$ is a height at a schottky junction when a PdSi gate is formed. Note that, both the surface and the back surface of the $Al_{0.25}Ga_{0.75}N$ layer is doped with Si at the same concentration.

As shown in FIG. 2, the height of schottky barrier decreases by approximately half to 0.534 eV in the case of (1 1 −2 0) plane which is the non-polar surface, compared to the case of (0 0 0 1) plane. In addition, the contact resistance decreases by approximately 60% to 8.22×10⁻⁶ Ωcm² in the case of (1 1 −2 0) plane which is the non-polar surface, compared to the case of (0 0 0 1) plane. As described above, it is assumed that the contact resistance on the interface of metal and semiconductor can be reduced, by forming the ohmic electrode on (1 1 −2 0) plane which is a non-polar surface, compared to the case of (0 0 0 1) plane which is a polar surface. With this, it is assumed that a field effect transistor with small parasitic resistance can be formed.

FIGS. 3A, 3B, 4A, 4B, 5A, 5B, 6A and 6B are respectively showing structures of the Heterojunction Field Effect Transistor (HFET) and its variations according to the first embodiment of the present invention.

Figure 3B:
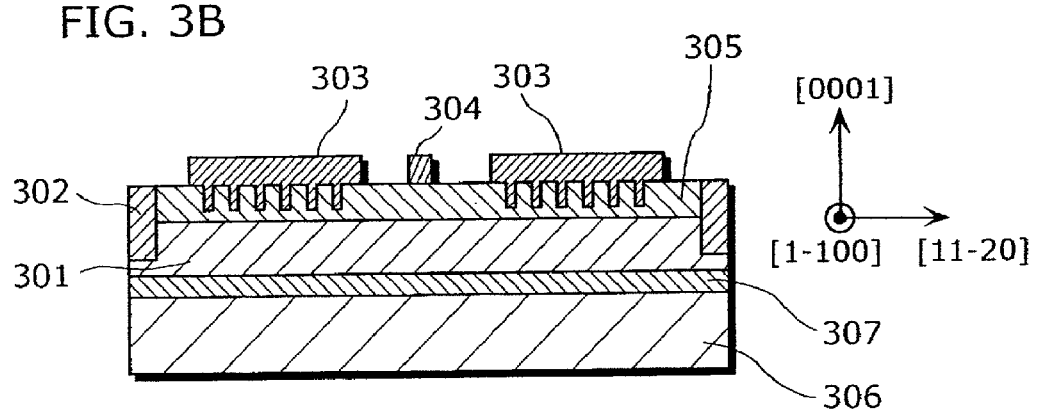
FIG. 3B is a cross-sectional view (at the line AA' in FIG. 3A) of the FET.

FIG. 3A is a top view of the HFET according to the first embodiment, and FIG. 3B is a cross-sectional view of the HFET (a cross-sectional view at the line AA' in FIG. 3A).

The HFET includes a GaN layer 301, a device isolation layer 302, an ohmic electrode 303, a gate electrode 304, an n-type $Al_{0.25}Ga_{0.75}N$ layer 305, a sapphire substrate 306, and a buffer layer 307. Note that the GaN layer 301 is an example of the third semiconductor layer according to the present invention.

In the HFET, the undoped GaN layer 301 with the thickness of 2 μm is formed on the sapphire substrate 306 having (0 0 0 1) plane as the main surface via the buffer layer 307, and the n-type $Al_{0.25}Ga_{0.75}N$ layer 305 with the thickness of 25 nm having (0 0 0 1) plane as the main surface is formed thereon. For example, after the device isolation layer 302 is formed by thermal oxidation, the ohmic electrode 303 made of Ti/Al and the gate electrode 304 made of PdSi are formed.

On the n-type $Al_{0.25}Ga_{0.75}N$ layer 305 under the ohmic electrode 303, plural concaves having non-polar surfaces such as (1 1 −2 0) plane or (1 −1 0 0) plane as sides are formed. The barrier height between the ohmic electrode 303 and the n-type $Al_{0.25}Ga_{0.75}N$ layer 305 is lowered by forming the ohmic electrode 303 in contact with these non-polar surfaces. This reduces the contact resistance between the source electrode and the drain electrode, and thus the serial resistance is significantly reduced. Note that the sides of the concaves are examples of the side of the nitride semiconductor layer according to the present invention.

The following is a manufacturing method for an HFET having the abovementioned structure.

More specifically, first, for example, on the sapphire substrate 306 having (0 0 0 1) plane as the main surface, the buffer layer 307 made of low-temperature GaN is grown by the metal organic chemical vapor deposition (MOCVD) method, and the GaN layer 301 is formed on the buffer layer 307 by growing undoped GaN by 2 μm. Note that the buffer layer 307 may be an AlN layer. After that, on the GaN layer 301, the n-type $Al_{0.25}Ga_{0.75}N$ layer 305 made of n-type $Al_{0.25}Ga_{0.75}N$ doped with Si and with the thickness of 25 nm is formed as an electron supply layer. In order to increase the sheet carrier concentration of the two-dimensional electron gas in the n-type $Al_{0.25}Ga_{0.75}N$ layer 305 at the hetero interface of $Al_{0.25}Ga_{0.75}N$/GaN, larger Al composition and thicker film thickness are preferred.

Subsequently, the device isolation layer 302 is formed by a selective thermal oxidation on a part of the n-type $Al_{0.25}Ga_{0.75}N$ layer 305 and a part of the GaN layer 301. Note that the device isolation layer 302 may be formed by selectively etching a part of the n-type $Al_{0.25}Ga_{0.75}N$ layer 305 and a part of the GaN layer 301. After that, the n-type $Al_{0.25}Ga_{0.75}N$ layer 305 is selectively etched (removed) by a dry etching method using resist masks such as the Inductively Coupled Plasma (ICP) method, a number of concaves with the depth of 10 nm and having (1 1 −2 0) plane and (1 −1 0 0) plane on the side are formed on the surface of the n-type $Al_{0.25}Ga_{0.75}N$ layer 305.

Here, when forming the ohmic electrode 303 on the surface of the n-type $Al_{0.25}Ga_{0.75}N$ layer 305, it is preferable that a number of concaves with a square prism form having (1 1 −2 0) plane or (1 −1 0 0) plane on the sides are formed in a grid-like pattern (a checkerboard pattern) as shown in FIG. 3A in order to increase the contact area with (1 1 −2 0) plane or (1 −1 0 0) plane to the maximum. For example, concaves are formed in such a manner that each of which is 1 μm per side (in width), and the distance between each of the concaves is 1 μm. When the ohmic electrode metal (Ti/Al) is deposited, the less the distance between the concaves are and the less the size of a concave is, the larger the contact dimension becomes as long as a sufficient contact between the concave side surfaces of the n-type $Al_{0.25}Ga_{0.75}N$ layer 305 and the ohmic electrode 303 is maintained. Thus it is desirable that the size of concaves and the distances between the concaves to be short.

Finally, the ohmic electrode metal (Ti/Al) is deposited on the n-type $Al_{0.25}Ga_{0.75}N$ layer 305 to form the ohmic electrode 303. After that, a gate electrode 304 is formed on the part of the n-type $Al_{0.25}Ga_{0.75}N$ layer 305 where concaves are not formed, stated differently, on (0 0 0 1) plane.

Figure 4A:
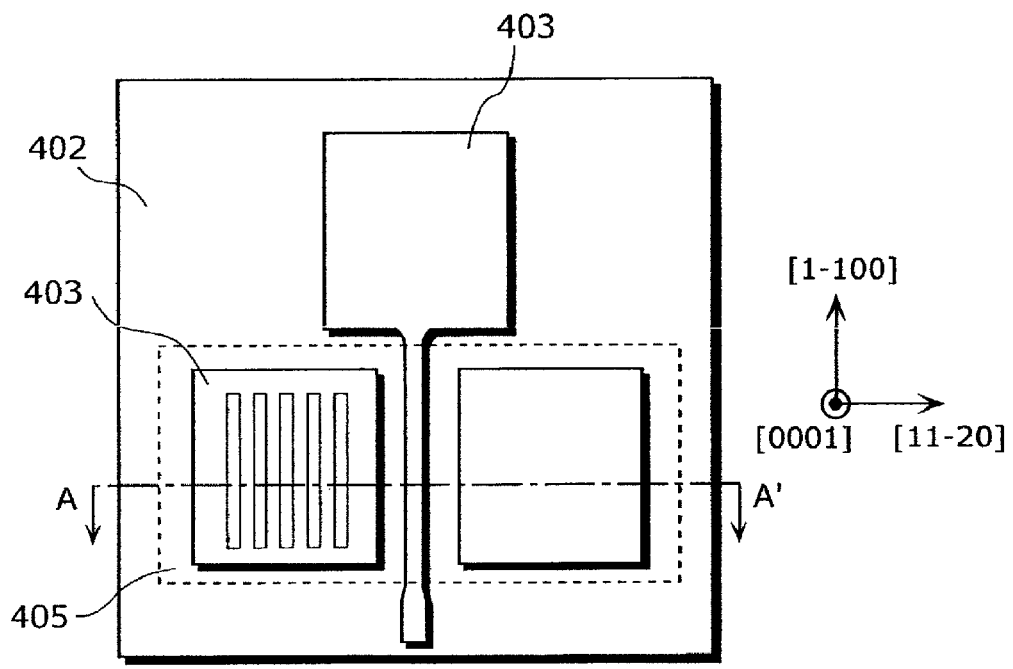
FIG. 4A is a top view of the variation of the HFET according to the first embodiment of the present invention.
Figure 4B:
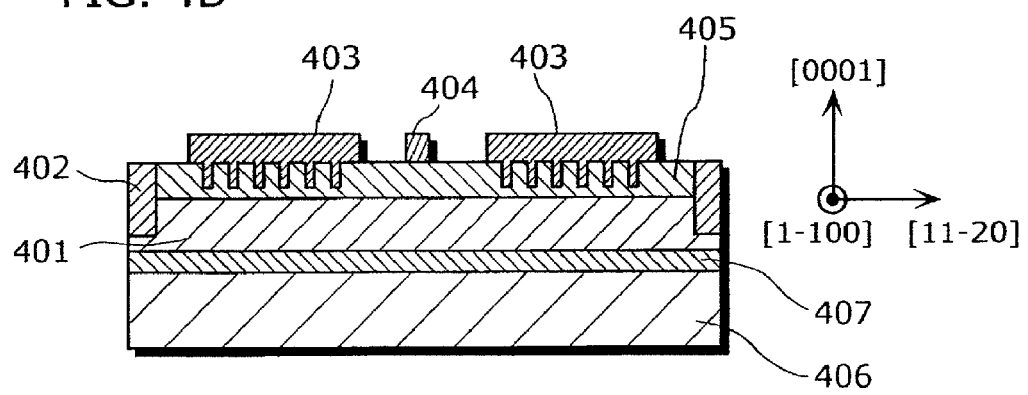
FIG. 4B is a cross-sectional view (at the line AA' of the HFET in FIG. 4A) of the HFET.

FIG. 4A is a top view of the HFET according to one of the variations of the first embodiment. FIG. 4B is a cross sectional view of the variation (a cross-sectional view at the AA' line in FIG. 4A).

The HFET includes a GaN layer 401, a device isolation layer 402, an ohmic electrode 403, a gate electrode 404, an n-type $Al_{0.25}Ga_{0.75}N$ layer 405, a sapphire substrate 406, and a buffer layer 407. Note that the GaN layer 401 is an example of the third semiconductor layer according to the present invention.

The HFET is different from the HFET in FIGS. 3A and 3B in that the concave part on the surface of the n-type $Al_{0.25}Ga_{0.75}N$ layer 405 is arranged in long stripes extended to [1 1 −2 0] direction or [1 −1 0 0] direction, instead of the grid like pattern shown in FIG. 4A.

Figure 5A:
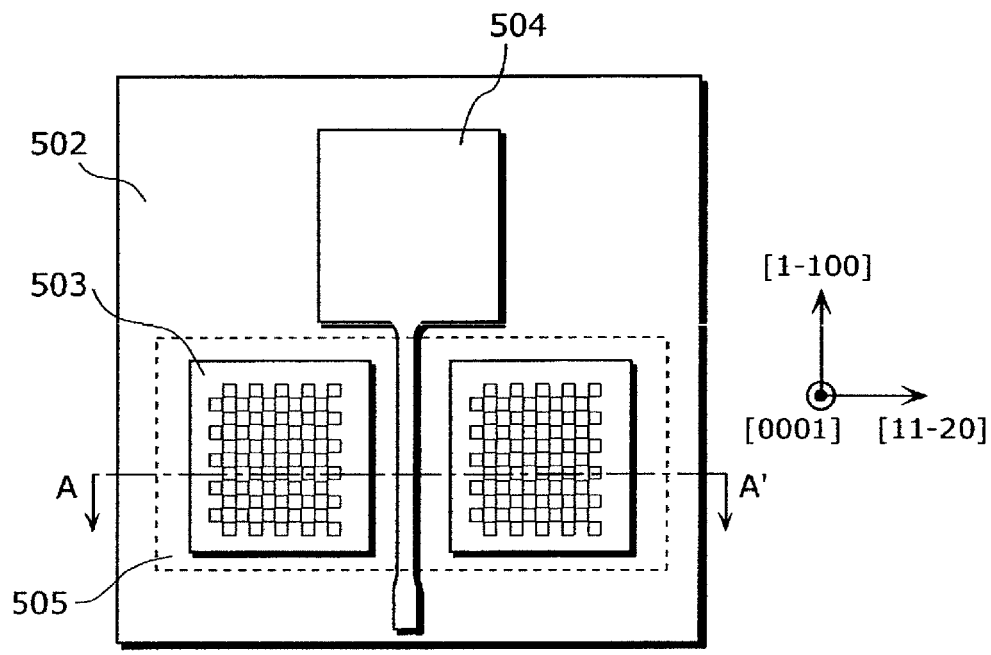
FIG. 5A is a top view of the variation of the HFET according to the first embodiment of the present invention.
Figure 5B:
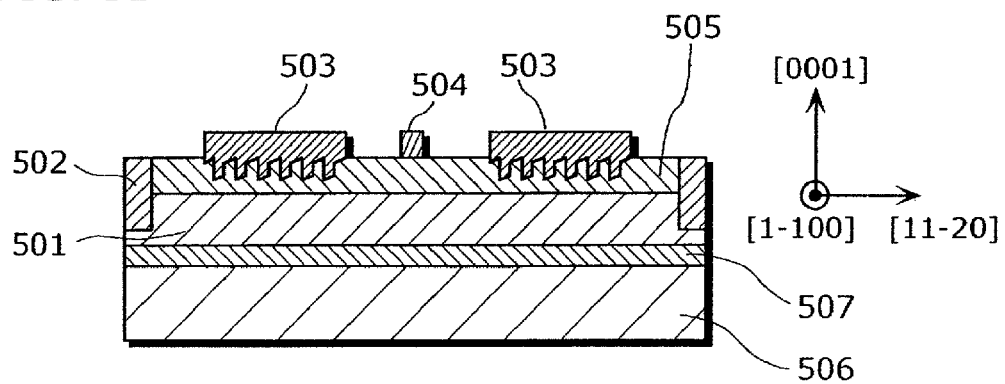
FIG. 5B is a cross-sectional view (at the line AA' in FIG. 5A) of the HFET.

FIG. 5A is a top view of another variation of the HFET according to the first embodiment, and FIG. 5B is a cross-sectional view of the variation (a cross-sectional view at the line AA' in FIG. 5A).

The HFET includes a GaN layer 501, a device isolation layer 502, an ohmic electrode 503, a gate electrode 504, an n-type $Al_{0.25}Ga_{0.75}N$ layer 505, a sapphire substrate 506 and a buffer layer 507. Note that the GaN layer 501 is an example of the third semiconductor layer according to the present invention.

The HFET is different from the HFET in FIGS. 3A and 3B in that the bottom surfaces of the concaves and the top surfaces of the convexes on the surface of n-type $Al_{0.25}Ga_{0.75}N$ layer 505 are formed as tilted surfaces, as shown in FIGS. 5A and 5B, for example, to be (0 3 −3 8) plane or (0 3 −3 16) plane. The ohmic contact resistance can further be reduced compared to the HFET having the bottom surface of (0 0 0 1) plane in FIGS. 3A, 3B, 4A and 4B since the bottom surfaces are less subject to the effect of polarized electric field compared to the case on (0 0 0 1) plane and the barrier height is reduced.

Such tilted surfaces on the bottom surfaces of the concaves and the top surfaces of the convexes can be formed by modifying a dry etching condition and a method for providing wafer in etching. More specifically, after concaves and convexes having (0 0 0 1) plane as the bottom surfaces of the concaves and the top surfaces of the convexes on the surfaces of the n-type $Al_{0.25}Ga_{0.75}N$ layer as shown in FIGS. 3A and 3B or FIGS. 4A and 4B are formed by dry etching, resist is applied to the surface of the n-type $Al_{0.25}Ga_{0.75}N$ layer. After that, with a lithography technology such as electron beam exposure, the resist is exposed to form concaves and convexes with tilted surfaces with respect to (0 0 0 1) plane after exposure, (0 3 −3 8) plane or (0 3 −3 16) plane on the surface, for example. Such a selective exposure can be realized by adjusting the dose amount, the beam current, and the accelerating voltage in the electron beam exposure. The tilted surfaces can be formed by a transfer of the surface shape of the resist to the n-type $Al_{0.25}Ga_{0.75}N$ layer.

Figure 6A:
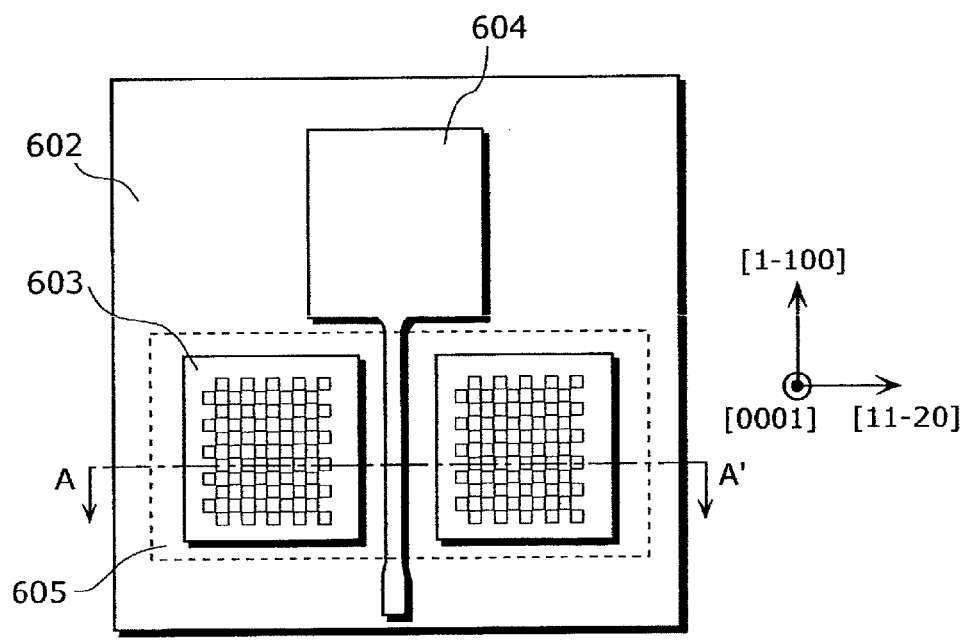
FIG. 6A is a top view of the variation of the HFET according to the first embodiment of the present invention.
Figure 6B:
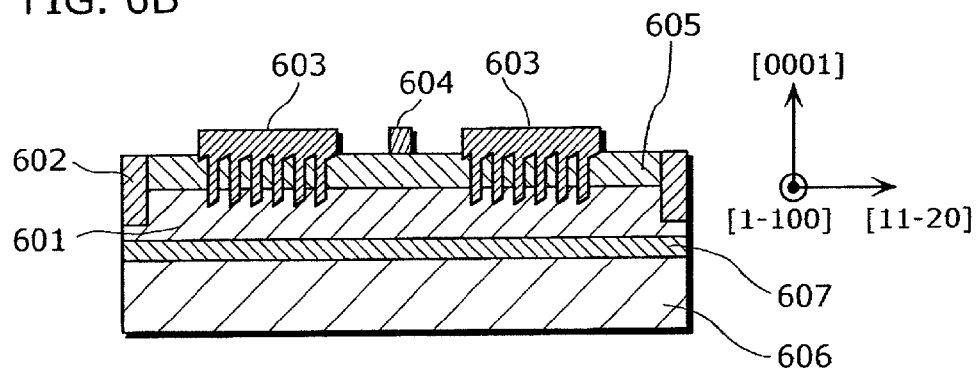
FIG. 6B is a cross-sectional view (at the line AA' in FIG. 6A) of the HFET.

FIG. 6A is another top view of the HFET according to the first embodiment, and FIG. 6B is a cross-sectional view of the variation (a cross-sectional view at the line AA' in FIG. 6A).

The HFET includes a GaN layer 601, a device isolation layer 602, an ohmic electrode 603, a gate electrode 604, an n-type $Al_{0.25}Ga_{0.75}N$ layer 605, a sapphire substrate 606, and a buffer layer 607. Note that the GaN layer 601 is an example of the third semiconductor layer according to the present invention.

The HFET is different from the HFET shown in FIGS. 5A and 5B in that concaves of the surface of the n-type $Al_{0.25}Ga_{0.75}N$ layer 605 passes through the n-type $Al_{0.25}Ga_{0.75}N$ layer 605 and reach the GaN layer 601 which is a two-dimensional electron gas layer. The contact resistance may be further reduced by forming a structure in which the ohmic electrode 603 and the two-dimensional electron gas of the electron channel layer directly comes in contact by having the depth of concaves on the surface of the n-type $Al_{0.25}Ga_{0.75}N$ layer at 50 nm, which is substantially the same thickness as that of the n-type $Al_{0.25}Ga_{0.75}N$ layer 605.

As described above, according to the HFET of the first embodiment, concaves are formed on the surface of a semiconductor layer on which Ti/Al making up the ohmic electrode and PdSi for forming the gate electrode are formed and the surfaces of the semiconductor layer in contact with the ohmic electrode are non-polar surfaces. Therefore, the contact resistance between the ohmic electrode and the semiconductor layer can be reduced and an HFET with low parasitic resistance can be realized.

Here, in the HFET shown in FIGS. 3A and 313, the reduction in contact resistance with respect to the number of concaves on the surface of the n-type $Al_{0.25}Ga_{0.75}N$ layer 305 is described.

Here, the contact area of the ohmic electrode 303 and the n-type $Al_{0.25}Ga_{0.75}N$ layer 305 is a square with "a" in the length of a side. On the surface of the n-type $Al_{0.25}Ga_{0.75}N$ layer 305, concaves each of which is a rod of square prism shape with a square bottom, and the plural concaves with dig depth "l" are formed, and the concaves divide the side with "a" in length into "m" pieces. Thus, the number of the concaves can be approximated at $m^2/2$. When the bottom of the concave is (0 0 0 1) plane and the side is (1 −1 2 0) plane or (1 −1 0 0) plane, the contact area $S_1$ between the ohmic electrode 303 and the polar surface, and the contact are $S_2$ between the ohmic electrode 303 and the non-polar surface can be represented as:

$$S_1 = a^2$$
$$S_2 = 4\frac{a}{m}l \times \frac{m^2}{2} = 2mal$$

Here, the contact resistance of the ohmic electrode 303 on the polar surface (0 0 0 1) plane is $R_c^p$, the contact resistance of the ohmic electrode 303 on the non-polar surface (1 −1 2 0) plane or (1−1 0 0) plane is $R_c^n$. The total ohmic contact resistance Rc can be approximated, using a simple model in which the sheet resistance of the n-type $Al_{0.25}Ga_{0.75}N$ layer 305 does not change depending on the dig depth l and the total ohmic contact resistance is described as an arithmetic average of each ohmic contact resistance:

$$R_C = \frac{R_C^p S_1 + R_C^n S_2}{S_1 + S_2} = \frac{a^2 R_C^p + 2malR_C^n}{a^2 + 2mal}$$

Based on FIG. 2, it is assumed that $R_c^p=1.43\times10^{-5}\cdot\Omega cm^2$ and $R_c^p=8.22\times10^{-6}\cdot\Omega cm^2$ and the depth l=5 nm. The relationship between the number of rod divisions, more specifically, the number of concaves and the total contact resistance is shown in the dashed line in FIG. 7. As the number of concaves increases, the contact area with the sides of the concaves increases, and the total ohmic contact resistance is reduced. In this case, the more the number of concaves is, the lower the total ohmic resistance becomes. However, when m exceeds 200, the size of a concave (rod) is 0.5 μm, which is close to the limit of exposure resolution using a stepper. As described above, in the HFET in FIGS. 3A and 3B, it is preferable to have a large number of rod divisions in a range which does not exceed the limit of resolution using an exposure apparatus.

Furthermore, in the HFET in FIGS. 5A and 5B, the reduction of the ohmic contact resistance with respect to the number of concaves is described. When the tilt angle with respect to (0 0 0 1) plane is θ, the contact area $S_0$ which is a contact area between the ohmic electrode 503 and a non-polar surface with respect to one of the concaves on the surface of the n-type $Al_{0.25}Ga_{0.75}N$ layer 505 can be represented as:

$$S_0 = \frac{a}{m}l + \frac{a}{m}\left(2l - \frac{a}{m}\tan\theta\right) + \frac{a}{m}\left(l - \frac{a}{m}\tan\theta\right) + \frac{a^2}{m^2}\frac{1}{\cos\theta}$$
$$= \frac{a}{m}\left(4l - \frac{2a}{m}\tan\theta\right) + \frac{a^2}{m^2}\frac{1}{\cos\theta}$$

Therefore, the contact areas $S_1$ and $S_2$ can be represented as:

$$S_1 = a^2/2$$
$$S_2 = \frac{m^2}{2}S_0 = am\left(2l - \frac{a}{m}\tan\theta\right) + \frac{2a^2}{\cos\theta}$$

and the total ohmic contact resistance $R_c$ can be approximated as:

$$R_C = \frac{R_C^p S_1 + R_C^n S_2}{S_1 + S_2} = \frac{\frac{a^2}{2}R_C^p + \left(am\left(2l - \frac{a}{m}\tan\theta\right) + \frac{2a^2}{\cos\theta}\right)R_C^n}{a^2/2 + am\left(2l - \frac{a}{m}\tan\theta\right) + \frac{2a^2}{\cos\theta}}$$

Figure 7:
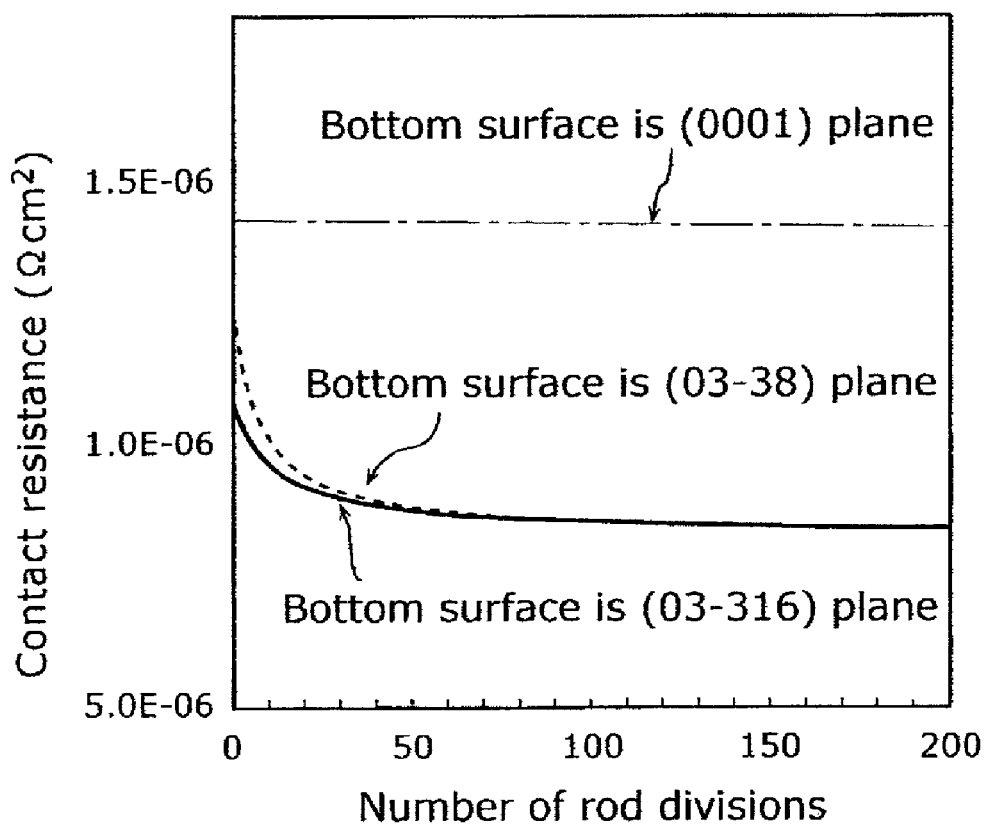
FIG. 7 is a chart showing a relationship between contact resistance and the number of concaves.

(0 3 −3 16) plane is tilted at 19.2°, and (0 3 −3 8) plane is tilted at 26.3° with respect to (0 0 0 1) plane, the total ohmic contact resistances is shown in the solid line and broken line in FIG. 7, respectively. FIG. 7 shows that as the number of rod division, more specifically, the number of concaves increases, the total ohmic contact resistance is reduced. FIG. 7 also shows that these cases are more effective compared to the case where the bottom surfaces of the concaves are (0 0 0 1) plane. The ohmic contact resistance is most significantly reduced in the case of (0 3 −3 16) plane, and if the number of rod divisions is 150 or more, the decrease in the total ohmic contact resistance is virtually saturated. Therefore, it is preferable to have 150 or more rod divisions.

Second Embodiment

Figure 8A:
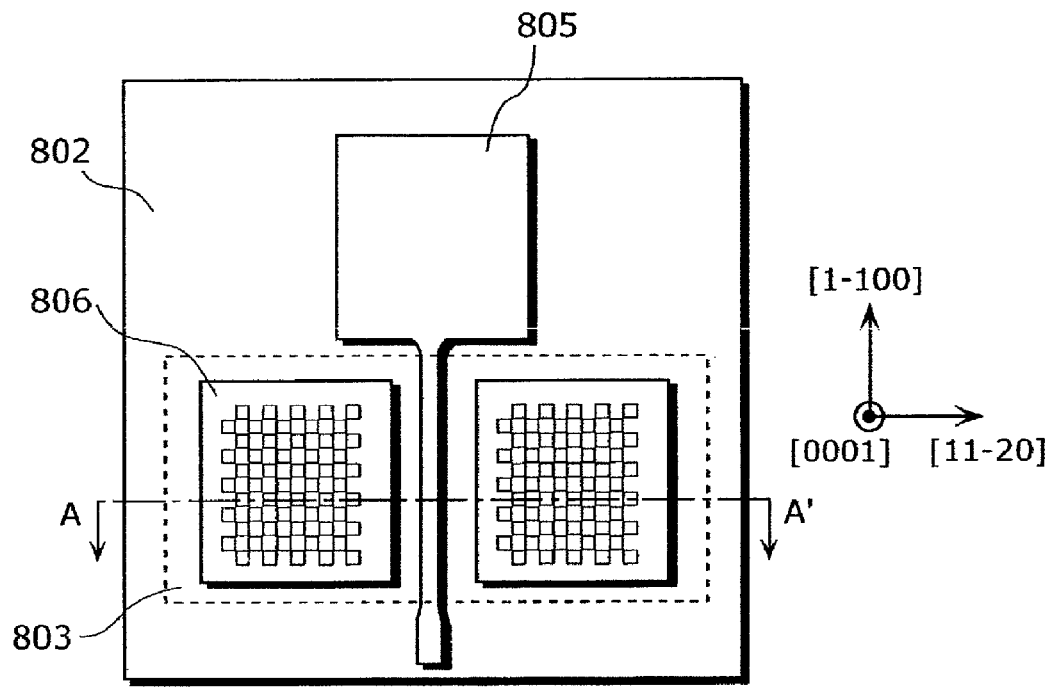
FIG. 8A is a top view of the HFET according to the second embodiment of the present invention.
Figure 8B:
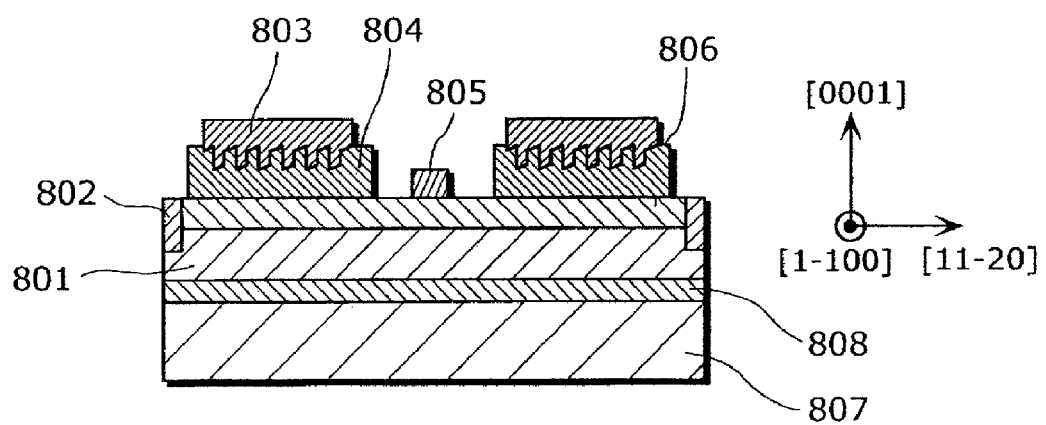
FIG. 8B is a cross-sectional view (at the line AA' in FIG. 8A) of the HFET.

FIG. 8A is a top view of the HFET according to the second embodiment of the present invention, and FIG. 8B is a cross-sectional view of the HFET (a cross-sectional view at line AA' in FIG. 8A).

The HFET includes a GaN layer 801, a device isolation layer 802, an ohmic electrode 803, an n-type cap layer 804, a gate electrode 805, an n-type $Al_{0.25}Ga_{0.75}N$ layer 806, a sapphire substrate 807 and a buffer layer 808. Note that, the cap layer 804 is an example of the first semiconductor layer according to the present embodiment, or stated differently, the low resistance cap layer. In addition, the GaN layer 801 is an example of the third semiconductor layer according to the present invention.

In the HFET, the undoped GaN layer 801 with the layer thickness of 2 μm is formed on the sapphire substrate 807 having (0 0 0 1) plane as the main surface via the buffer layer 808, and the n-type $Al_{0.25}Ga_{0.75}N$ layer 806 with the thickness of 25 nm is formed thereon. On the n-type $Al_{0.25}Ga_{0.75}N$ layer 806, a cap layer 804 with the layer thickness of 50 nm made of a AlGaN/GaN superlattice layer in which, for example, AlGaN and GaN are alternately laminated, having (0 0 0 1) plane as a main surface is formed. For example, after the device isolation layer 802 is formed by thermal oxidation, the ohmic electrode 803 made of Ti/Al and the gate electrode 805 made of PdSi are formed. Note that the cap layer 804 may be made of $In_xAl_yGa_{1-x-y}N$ (0<x<1, 0<y<1).

On the cap layer 804 under the ohmic electrode 803, concaves having (1 1 −2 0) plane or (1 −1 0 0) plane as sides and having (0 3 −3 8) plane or (0 3 −3 16) plane as top surfaces, and convexes having (1 1 −2 0) plane or (1 −1 0 0) plane as sides and having (0 3 −3 8) plane or (0 3 −3 16) plane as bottom surfaces are formed. The barrier height between the ohmic electrode 803 and the cap layer 804 is lowered by forming the ohmic electrode 803 in contact with the non-polar surfaces. This reduces the contact resistance between the source electrode and the drain electrode, and thus the serial resistance can be significantly reduced.

In the HFET according to the second embodiment, the low resistance cap layer 804 is formed under the ohmic electrode 803, and thus the serial resistance is further reduced. The contact resistance is further reduced since concaves and convexes with non-polar surfaces are formed on the cap layer 804.

The following is a manufacturing method of an HFET having the abovementioned structure.

More specifically, first, for example, on the sapphire substrate 807 having (0 0 0 1) plane as the main surface, the buffer layer 808 made of low-temperature GaN is grown by the metal organic chemical vapor deposition (MOCVD) method, and the GaN layer 801 is formed on the buffer layer 808 by growing undoped GaN by 2 μm. Note that the buffer layer 808 may be an AlN layer. After that, on the GaN layer 801, the n-type $Al_{0.25}Ga_{0.75}N$ layer 806 made of n-type $Al_{0.25}Ga_{0.75}N$ doped with Si with the thickness of 25 nm is formed as an electron supply layer. In order to increase the sheet carrier concentration of the two-dimensional electron gas in the n-type $Al_{0.25}Ga_{0.75}N$ layer 806 at the hetero interface of $Al_{0.25}Ga_{0.75}N/GaN$, larger Al composition and thicker film thickness are preferred.

Subsequently, the cap layer 804 with the thickness of 50 nm is formed by periodically laminating $Al_{0.25}Ga_{0.75}/GaN$, for example, for 7 cycles. Thereafter, a part of the cap layer 804 is selectively etched for forming the device isolation layer 802. Note that, a part of the cap layer may be selectively treated by thermal oxidation for forming the device isolation layer 802. In addition, the cap layer 804 may be a n-type GaN layer or $In_xAl_yGa_{1-x-y}N$ layer (0<x<1, 0<y<1). Such low resistance cap layer 804 reduces the serial resistance between the source and the drain.

Next, a part of the n-type $Al_{0.25}Ga_{0.75}$ layer 806 and the GaN layer 801 is selectively treated by thermal oxidation to form the device isolation layer 802. After that, the cap layer 804 is selectively etched by a dry etching method such as the ICP using resist masks, for example, plural concaves with 10 nm in depth having (1 1 −2 0) plane or (1 −1 0 0) plane as sides, and having (0 3 −3 8) plane or (0 3 −3 16) as bottom surfaces are formed.

Here, the concaves of the surface of the cap layer 804, in the same manner as described in the HFET in the first embodiment, are formed as many concaves having sides of (1 1 −2 0) plane or (1 −1 0 0) plane in square prism form arranged in a matrix as shown in FIG. 8B so as to maximize the contact area with (1 1 −2 0) plane or (1 −1 0 0) plane when forming the ohmic electrode 803.

Finally, ohmic electrode metal (Ti/Al) is deposited on the cap layer 804 to form the ohmic electrode 803. Subsequently, the gate electrode 805 made of PdSi is formed.

As described above, according to the HFET of the second embodiment, the ohmic contact resistance is reduced by having the ohmic electrode in contact with the so-called non-polar surface, and thus an HFET with low parasitic resistance can be realized.

Note that, the concaves on the surface of the cap layer 804 may be arranged in long stripe forms toward [1 1 −2 0] direction or [1 −1 0 0] direction, instead of a grid-like pattern. In this case, the ohmic contact resistance can be reduced since the ohmic electrode contacts a non-polar surface or a surface less subject to the polarized electric field.

Furthermore, the concaves on the surface of the cap layer 804 may reach the GaN layer 801 which is a two-dimensional electron gas layer. By having the depth of concave at 50 nm or more, that is, substantially same as the layer thickness of the n-type $Al_{0.25}Ga_{0.75}N$ layer 806 and the layer thickness of the cap layer 804, the ohmic electrode 803 directly contacts the two-dimensional electron gas which is the electron channel layer, the ohmic contact resistance can further be reduced.

Third Embodiment

Figure 9A:
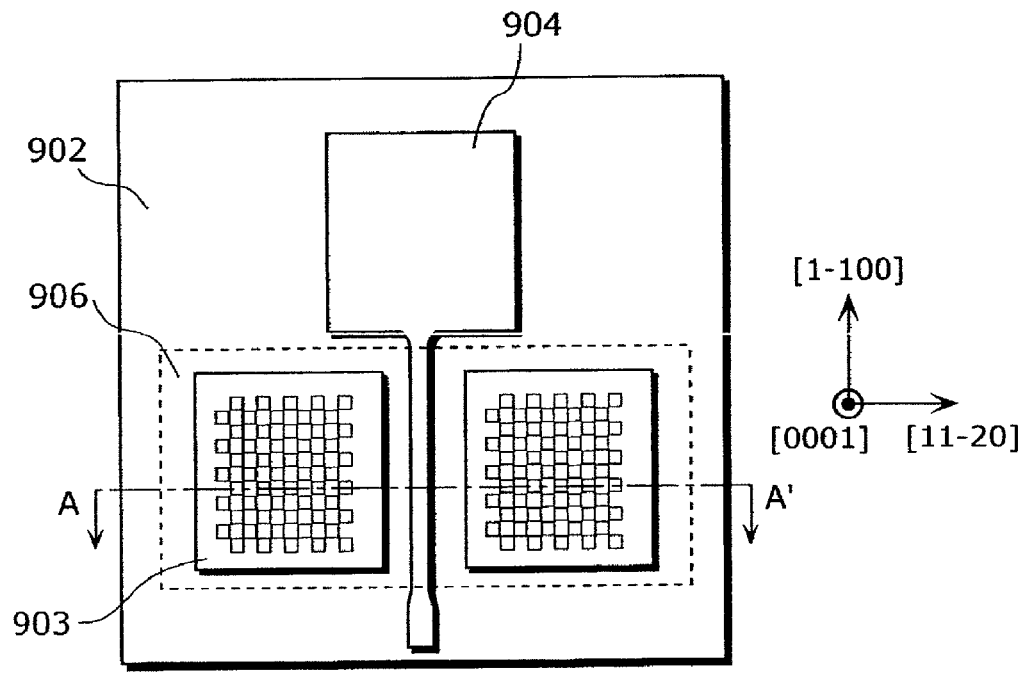
FIG. 9A is a top view of the HFET according to the third embodiment of the present invention.
Figure 9B:
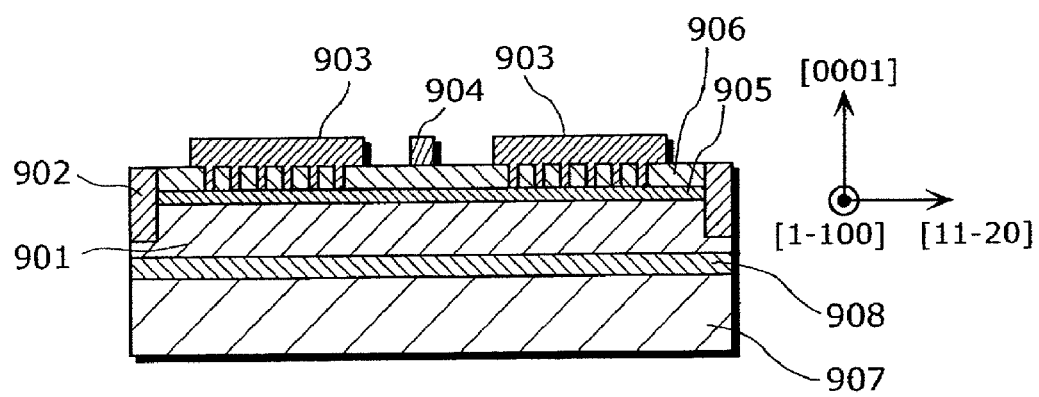
FIG. 9B is a cross-sectional view (at the line AA' in FIG. 9A) of the HFET according to the present invention.

FIG. 9A is a top view of the HFET according to the third embodiment, and FIG. 9B is a cross-sectional view (a cross-sectional view at the line AA' in FIG. 9A) of the HFET.

The HFET includes a GaN layer 901, a device isolation layer 902, an ohmic electrode 903, a gate electrode 904, a first n-type $Al_{0.25}Ga_{0.75}N$ layer 905, a second n-type $Al_{0.25}Ga_{0.75}N$ layer 906, a sapphire substrate 907 and a buffer layer 908. Note that the GaN layer 901 is an example of the third semiconductor layer according to the present invention. In addition, the first n-type $Al_{0.25}Ga_{0.75}N$ layer 905 and the second n-type $Al_{0.25}Ga_{0.75}N$ layer 906 are respectively an example of the first nitride semiconductor layer and the second nitride semiconductor layer of the present invention.

In the HFET, the undoped GaN layer 901 with the thickness of 2 μm is formed on the sapphire substrate 907 having (0 0 0 1) plane as the main surface via the buffer layer 908, the n-type $Al_{0.25}Ga_{0.75}N$ layer 905 with the thickness of 15 nm is formed thereon, and the second n-type $Al_{0.25}Ga_{0.75}N$ layer 906 with the thickness of 10 nm having a main surface of (0 0 0 1) plane is selectively formed thereon. For example, after the device isolation layer 902 is formed by thermal oxidation, the ohmic electrode 903 made of Ti/Al and the gate electrode 904 made of PdSi are formed.

On the second $Al_{0.25}Ga_{0.75}N$ layer 906, plural concaves having non-polar surfaces such as (1 1 −2 0) plane or (1 −1 0 0) plane as sides, and pass through the second n-type $Al_{0.25}Ga_{0.75}N$ layer 906 are formed. The barrier height between the ohmic electrode 903 and the second n-type $Al_{0.25}Ga_{0.75}N$ layer 906 is lowered by forming the ohmic electrode 903 in contact with these non-polar surfaces. This reduces the contact resistance of the source electrode and the drain electrode, and thus the serial resistance can be significantly reduced.

Figure 10:
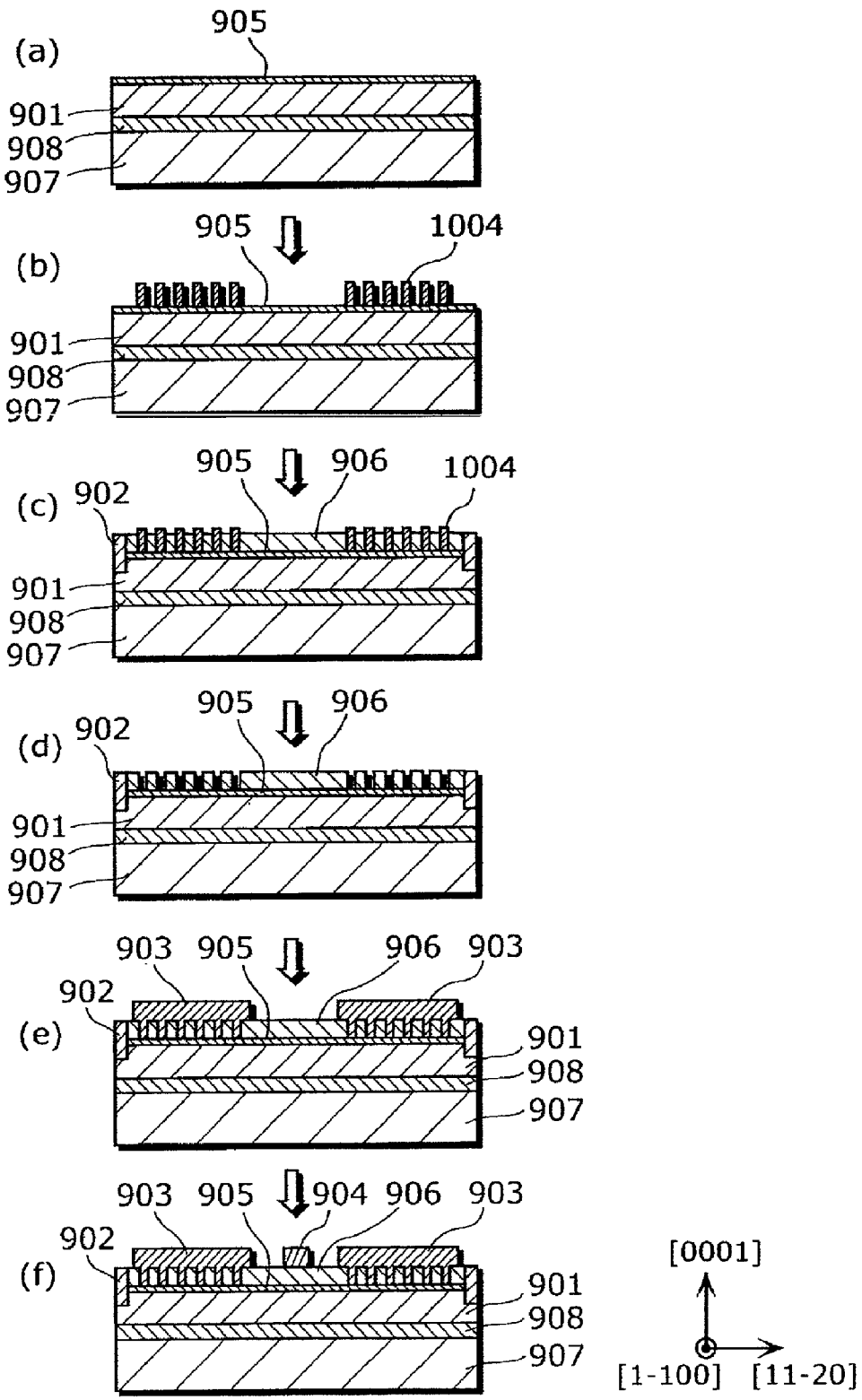
FIG. 10 is a cross-sectional view for explaining the manufacturing method of the HFET according to the third embodiment of the present invention.

The following is a manufacturing method of an HFET having the abovementioned structure. FIG. 10 is a cross-sectional diagram for explaining the manufacturing method of the HFET.

First, on the sapphire substrate 907 having (0 0 0 1) plane as the main surface, for example, the buffer layer 908 made of low-temperature GaN is grown by the MOCVD method, and the GaN layer 901 is formed on the buffer layer 908 by growing undoped GaN by 2 μm. Note that the buffer layer 908 may be an MN layer. Subsequently, on the GaN layer 901, the first n-type $Al_{0.25}Ga_{0.75}N$ layer 905 made of n-type $Al_{0.25}Ga_{0.75}N$ doped with Si with the thickness of 10 nm is formed as an electron supply layer (FIG. 10 (a)). In order to increase the sheet carrier concentration of the two-dimensional electron gas in the first n-type $Al_{0.25}Ga_{0.75}N$ layer 905 at the hetero interface of $Al_{0.25}Ga_{0.75}N/GaN$, larger Al composition and thicker film thickness are preferred.

Subsequently, an $SiO_2$ film with an opening of 100 nm is selectively formed on the first n-type $Al_{0.25}Ga_{0.75}N$ layer 905 in a matrix, for example, by plasma Chemical Vapor Deposition (CVD) (FIG. 10 (b)). After that, $Al_{0.25}Ga_{0.75}N$ doped with n-type impurity by, for example, the MOCVD method is grown by 15 nm to form the second $Al_{0.25}Ga_{0.75}N$ layer 906. Then, a part of the GaN layer 901, a part of the first n-type $Al_{0.25}Ga_{0.75}N$ layer 905 and a part of the second n-type $Al_{0.25}Ga_{0.75}N$ layer 906 is selectively treated by thermal oxidation to form the device isolation layer 902 (FIG. 10 (c)). When the re-growth of the $Al_{0.25}Ga_{0.75}N$ layer, the $SiO_2$ film serves as a mask, and thus crystal growth of $Al_{0.25}Ga_{0.75}N$ does not occur on the $SiO_2$ film, but crystal growth of $Al_{0.25}Ga_{0.75}N$ selectively occurs on the first n-type $Al_{0.25}Ga_{0.75}N$ layer 905 which is exposed at the opening of the $SiO_2$ film (FIG. 10 (d)). Therefore, concaves having the (1 1 −2 0) plane and (1 −1 0 0) plane as sides are formed on the second n-type $Al_{0.25}Ga_{0.75}N$ layer 906.

Here, the $SiO_2$ film is arranged so as to maximize the contact area of the ohmic electrode 903 and (1 1 −2 0) plane or (1 −1 0 0) plane. More specifically, the $SiO_2$ film in rod shape of the square prism having (1 1 −2 0) plane or (1 −1 0 0) plane on the side are to be formed in the form of multiple islands on the first n-type $Al_{0.25}Ga_{0.75}N$ layer 905.

Finally, the $SiO_2$ film is removed by hydrofluoric acid solution (FIG. 10 (d)). After that, ohmic electrode metal (Ti/Al) is deposited on the second n-type $Al_{0.25}Ga_{0.75}N$ layer 906 and on the first n-type $Al_{0.25}Ga_{0.75}N$ layer 905 exposed on the concaves of the second n-type $Al_{0.25}Ga_{0.75}N$ layer 906 to form the ohmic electrode 903 contacting the sides of the concaves of the second n-type $Al_{0.25}Ga_{0.75}N$ layer 906 (FIG. 10 (e)). Furthermore, on the part where the concaves of the second n-type $Al_{0.25}Ga_{0.75}N$ layer 906 are not formed, the gate electrode 904 made of PdSi is formed (FIG. 10 (f)).

As described above, according to the HFET of the third embodiment, the ohmic contact resistance is reduced by having the ohmic electrode in contact with the so-called non-polar surface, and thus an HFET with low parasitic resistance can be realized.

Fourth Embodiment

Figure 11:
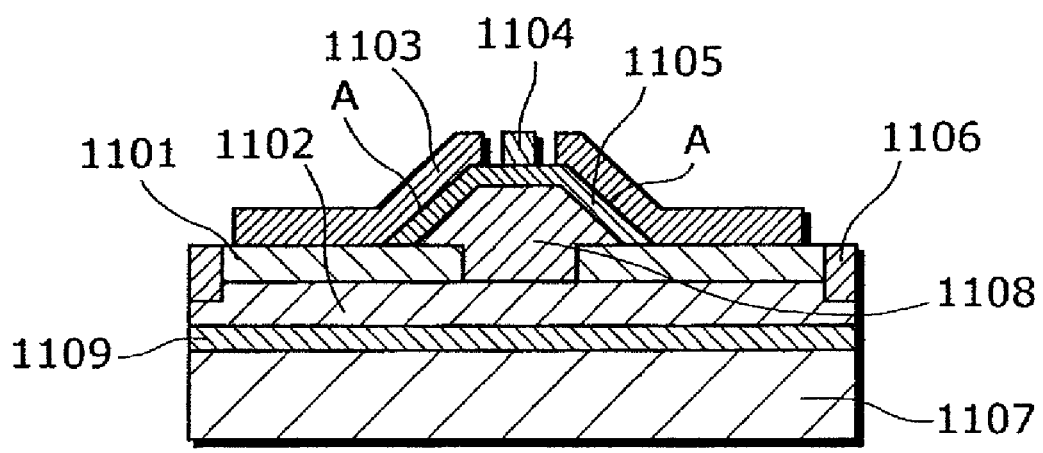
FIG. 11 is a cross-sectional view of the HFET according to the fourth embodiment of the present invention.

FIG. 11 is a cross-sectional view of the HFET according to the fourth embodiment.

The HFET includes an $SiO_2$ film 1101, a first GaN layer 1102, an ohmic electrode 1103, a gate electrode 1104, an n-type $Al_{0.25}Ga_{0.75}N$ layer 1105, a device isolation layer 1106, a sapphire substrate 1107, a second GaN layer 1108 and a buffer layer 1109. Note that the first GaN layer 1102 is an example of the second semiconductor layer and the foundation layer of the present invention. In addition, the second GaN layer 1108 is an example of the third semiconductor layer according to the present invention.

In the HFET, the first undoped GaN layer 1102 is formed on the sapphire substrate 1107 having (0 0 0 1) plane as the main surface via the buffer layer 1109, and a $SiO_2$ film 1101 with an opening is formed thereon. On the first GaN layer 1102, the second to GaN layer 1108 with the thickness of 1 µm is formed by crystal growth of undoped GaN from the first GaN layer 1102 exposed at the opening of the $SiO_2$ film 1101, and the n-type $Al_{0.25}Ga_{0.75}N$ layer 1105 with the thickness of 25 nm is formed thereon. For example, after the device isolation layer 1106 is formed by thermal oxidation, the ohmic electrode 1103 made of Ti/Al and the gate electrode 1104 made of PdSi are formed.

The ohmic electrode 1103 is formed contacting the sides of the n-type $Al_{0.25}Ga_{0.75}N$ layer 1105 which has grown via the opening of the $SiO_2$ film 1101. The facets on the oblique sides of the n-type $Al_{0.25}Ga_{0.75}N$ layer 1105 (A in FIG. 11), is on (0 3 −3 8) plane or (0 3 −3 16) plane which is a non-polar surface, however, may also be on (1 1 −2 0) plane or (1 −1 0 0) plane depending on the growth condition. As described above, by forming the ohmic electrode 1103 on the non-polar surface which is not subject to the polarized electric field other than (0 0 0 1) plane, the barrier height between the ohmic electrode 1103 and the n-type $Al_{0.25}Ga_{0.75}N$ layer 1105 is reduced, and thus the contact resistance of the ohmic electrode 1103 can be reduced. As a result, the contact resistance between the source electrode and the drain electrode are reduced, and thus the serial resistance can be significantly reduced. Note that the sides of the n-type $Al_{0.25}Ga_{0.75}N$ layer 1105 are examples of the sides of the nitride semiconductor layer according to the present invention.

Figure 12:
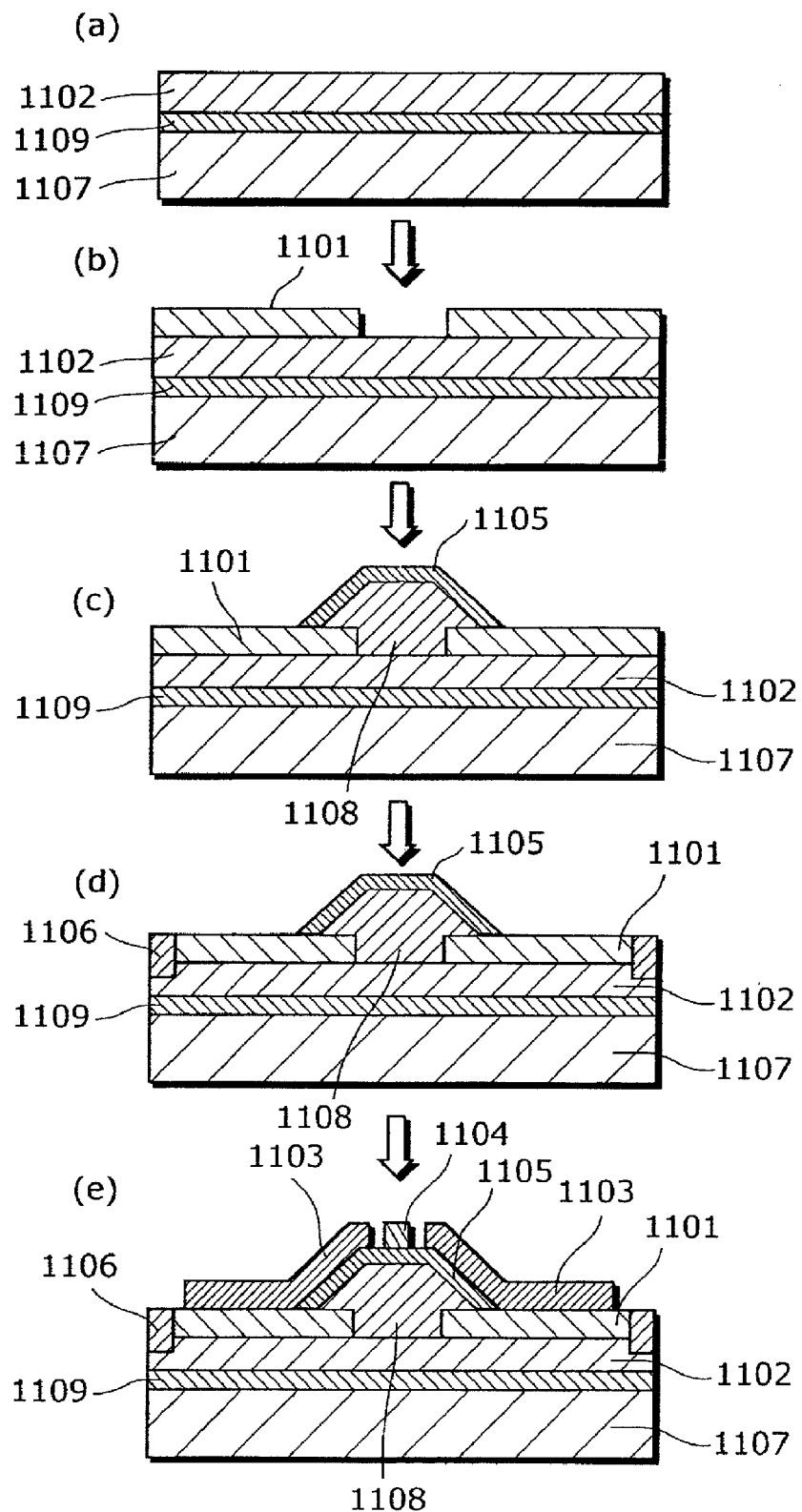
FIG. 12 is a cross-sectional view for explaining the manufacturing method of the HFET according to the fourth embodiment of the present invention.

The following is a manufacturing method of an HFET having the abovementioned structure. FIG. 12 is a cross-sectional diagram for explaining the manufacturing method of the HFET.

First, for example, on the sapphire substrate 1107 having (0 0 0 1) plane as the main surface, the buffer layer 1109 made of low-temperature GaN is grown by the MOCVD method, and the first GaN layer 1102 is formed on the buffer layer 1109 by growing undoped GaN by 2 µm. Note that the buffer layer 1109 may be an AlN layer. After that, on the first GaN layer 1102, the $SiO_2$ film 1101 with the thickness of 100 nm is formed by the plasma CVD method, and an opening arranged in a stripe in <1 −1 0 0> direction and 4 µm in width is formed on the $SiO_2$ film 1101 (FIG. 12(b)).

Subsequently, the second GaN layer 1108 is formed by growing GaN by the MOCVD method again, for example, by 2 µm. This growth is the so-called Epitaxial Lateral Overgrowth (ELO) that GaN grows in <0 0 0 1> direction above the opening of the $SiO_2$ film 1101, grows laterally above the non-opening part, and does not grow on the $SiO_2$ film 1101. By optimizing the growth condition for GaN, for example, the growth temperature and the pressure inside the growth furnace, the second GaN layer 1108 which is on (0 0 0 1) plane on the top surface above the opening of the $SiO_2$ film 1101, and is on, for example, (0 3 −3 8) plane or (0 3 −3 16) plane, a tilted side against (0 0 0 1) plane on the sides above the non-opening part of the $SiO_2$ film is formed.

Subsequently, on the second GaN layer 1108, the n-type $Al_{0.25}Ga_{0.75}N$ layer 1105 made of n-type $Al_{0.25}Ga_{0.75}N$ doped with Si with the thickness of 25 nm is formed as an electron supply layer (FIG. 12 (c)). The flat top surface of the n-type $Al_{0.25}Ga_{0.75}N$ layer 1105 above the opening of the $SiO_2$ film 1101 is made as (0 0 0 1) plane, and two-dimensional electron gas can be formed by the polarized electric field. On the other hand, the sides above the non-opening parts are made as non-polar surfaces other than (0 0 0 1) plane, a low-contact resistance ohmic electrode 1103 can be formed by forming the ohmic electrode 1103 on the sides. In order to increase the sheet carrier concentration of the two-dimensional electron gas at the hetero interface of $Al_{0.25}Ga_{0.75}N/GaN$ in the n-type $Al_{0.25}Ga_{0.75}N$ layer 1105, larger Al composition and thicker film thickness are preferred.

Subsequently, a part of the $SiO_2$ film 1101 and a part of the first GaN layer 1102 are selectively treated by thermal oxidation to form the device isolation layer 1106.

Finally, the ohmic electrode 1103 is formed by deposition of ohmic electrode metal (Ti/Al) in contact with the (0 3 −3 8) plane or (0 3 −3 16) plane on the sides of the n-type $Al_{0.25}Ga_{0.75}N$ layer 1105. After that, the gate electrode 1104 made of PdSi is formed in contact with (0 0 0 1) plane on the top of the n-type $Al_{0.25}Ga_{0.75}N$ layer 1105 (FIG. 10 (*e*)).

As described above, according to the HFET of the fourth embodiment, the ohmic contact resistance is reduced by having the ohmic electrode on a non-polar surface other than (0 0 0 1) plane which suppresses the effect of polarized electric field, and thus an HFET with low parasitic resistance can be realized.

In addition, according to the HFET of the fourth embodiment, a GaN layer and an AlGaN layer are selectively formed on a substrate, and thus stress in a wafer is reduced. For example, on a substrate such as a sapphire substrate and a Si substrate, the stress when forming a transistor is reduced, and occurrence of crack can be controlled.

As described above, the nitride semiconductor device and the manufacturing method thereof is described based on the embodiments, however, the present invention is not limited to the embodiments. Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, an HFET is used as an example of the nitride semiconductor devices in the embodiments, however, the nitride semiconductor device may not be limited to the HFET since the similar effect can be achieved by other nitride semiconductor devices including an ohmic electrode and a nitride semiconductor layer such as a schottky diode, a light-emitting diode and a semiconductor laser device.

In addition, an HFET having (0 0 0 1) plane as a surface for forming a gate electrode is shown in the embodiments, however, a plane on which the gate electrode is formed may have a cut-off angle. In addition, on the surface where an ohmic electrode is formed, any plane direction may be used other than (1 1 −2 0) plane and (1 −1 0 0) plane as long as the plane is effective for reducing the barrier height and is other than (0 0 0 1) plane.

In addition, the group III nitride semiconductor layers such as the $Al_{0.25}Ga_{0.75}N$ layer, the GaN layer, the $In_xAl_yGa_{1-x-y}N$ layer (0<x<1, 0<y<1), and the super-lattice layer of AlGaN/GaN are shown as examples of nitride semiconductor layer, however, it is not limited to those layers but any layer made of nitride semiconductor.

In addition, the $SiO_2$ film is shown as an example of a dielectric film, however, the dielectric film may not be limited to the $SiO_2$ film but may be SiN, for example.

In addition, in the embodiments above, the concaves having (1 1 −2 0) plane or (1 −1 0 0) plane as sides are formed on the nitride semiconductor layer in contact with the ohmic electrode, however, concaves having (0 3 −3 8) plane or (0 3 −3 16) plane as sides may also be formed.

Furthermore, in the embodiments above, the AlGaN layer is in contact with the ohmic electrode, and the AlGaN layer is formed on the GaN layer. However, the GaN layer may be in contact with the ohmic electrode and the GaN layer may be formed on the AlGaN layer.

INDUSTRIAL APPLICABILITY

The present invention is effective for a nitride semiconductor device and a manufacturing method thereof, and is particularly useful for a high-output power switching transistor and a high-output high frequency transistor.

What is claimed is:
1. A nitride semiconductor device comprising:
    a nitride semiconductor layer; and
    an ohmic electrode;
    wherein a plurality of concave portions and a plurality of convex portions are formed on a surface of said nitride semiconductor layer,
    wherein a side of one of the concave portions is a non-polar surface and is in contact with the ohmic electrode.
2. The nitride semiconductor device according to claim 1, wherein the nitride semiconductor layer includes a main surface on (0001) plane.
3. The nitride semiconductor device according to claim 1, wherein direction along the side is <1-100> direction.

* * * * *